United States Patent
Bhattad (10) Patent No.: US 9,395,731 B2
(45) Date of Patent: Jul. 19, 2016

(54) CIRCUIT TO REDUCE OUTPUT CAPACITOR OF LDOS

(71) Applicant: Dialog Semiconductor GmbH, Kirchheim/Teck-Nabern (DE)

(72) Inventor: Ambreesh Bhattad, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 41 days.

(21) Appl. No.: 14/477,079

(22) Filed: Sep. 4, 2014

(65) Prior Publication Data

US 2015/0061772 A1 Mar. 5, 2015

Related U.S. Application Data (60) Provisional application No. 61/873,904, filed on Sep. 5, 2013.

(51) Int. Cl.
*G05F 1/00* (2006.01)
*G05F 1/56* (2006.01)
*H03F 1/08* (2006.01)
*G05F 3/26* (2006.01)

(52) U.S. Cl.
CPC ........ *G05F 1/56* (2013.01); *G05F 3/262* (2013.01); *H03F 1/086* (2013.01); *H03F 2200/267* (2013.01)

(58) Field of Classification Search
CPC ........... G05F 1/575; G05F 3/262; G05F 1/56; H03F 1/086; H03F 2200/267
USPC ........................................................ 323/273
See application file for complete search history.

(56) References Cited

U.S. PATENT DOCUMENTS

| | | | | |
|---|---|---|---|---|
| 6,977,490 B1 * | 12/2005 | Zhang | ..................... | G05F 1/575 323/280 |
| 7,218,087 B2 * | 5/2007 | Lin | ......................... | G05F 1/575 323/280 |
| 7,843,180 B1 * | 11/2010 | Cilingiroglu | ........... | G05F 1/575 323/273 |
| 2007/0216382 A1 * | 9/2007 | Lin | ......................... | G05F 1/575 323/273 |
| 2011/0156673 A1 * | 6/2011 | Kim | ......................... | G05F 1/575 323/280 |
| 2012/0182167 A1 | 7/2012 | Wakimoto | | |
| 2013/0147447 A1 | 6/2013 | Liu et al. | | |
| 2013/0257401 A1 * | 10/2013 | Fort | ......................... | G05F 1/46 323/280 |

FOREIGN PATENT DOCUMENTS

DE EP 2520998 A1 * 11/2012 .............. G05F 1/575

OTHER PUBLICATIONS

European Search Report 14183774.0-1807, Feb. 9, 2015, Dialog Semiconductor GmbH.

(Continued)

*Primary Examiner* — Adolf Berhane
*Assistant Examiner* — Alex Torres-Rivera
(74) *Attorney, Agent, or Firm* — Saile Ackerman LLC; Stephen B. Ackerman (57) ABSTRACT

Circuits and methods to reduce the size of output capacitors of LDOs or amplifiers are disclosed. Nonlinear mirroring of the load current allows scaling of gain or adapting small signal impedance of a pass transistor depending on other inputs, in case of a preferred embodiment, allows to reduce small signal impedance at the gate of the pass transistor as the load current increases, hence allowing to reduce the size of an output capacitor without compromising stability of the system.

16 Claims, 5 Drawing Sheets

(56) References Cited

OTHER PUBLICATIONS

"A Chip-Area-Efficient CMOS Low-Dropout Regulator Using Wide-Swing Voltage Buffer with Parabolic Adaptive Biasing for Portable Applications," by Yonggen Liu, et al., IEEE Asian Solid-State Circuits Conference, Nov. 12-14, 2012/Kobe, Japan, pp. 233-236.

"A Zero-ESR Stable Adaptively Biased Low-dropout Regulator in Standard CMOS Technology," by Min Tan, IEEE 8th International Conference on IEEE, Piscataway, NJ, USA, Oct. 20, 2009, pp. 1185-1188.

* cited by examiner

CIRCUIT TO REDUCE OUTPUT CAPACITOR OF LDOS

This application claims priority of U.S. Provisional Application No. 61/873,904, filed Sep. 5, 2013, owned by a common owner of the instant application and which is herein incorporated by reference in its entirety.

TECHNICAL FIELD

This disclosure relates generally to electronic circuits and relates in particular output capacitors of Low Drop-Out (LDO) regulators.

BACKGROUND

In present designs a large external decoupling capacitor is needed at the output of an LDO for increasing the separation between the pole at the output and pole at gate of a pass device under low to medium range of load current.

A larger capacitor requires a larger footprint on the printed circuit board (PCB) real estate which is very expensive for handheld applications.

Larger external decoupling capacitors would result in longer time to charge and discharge. If the LDO/Amplifier is regularly enabled or disabled it would add to loss in charge of battery.

Disadvantages of present designs are:
Limited stability
Output capacitor size
Large output impedance for driver stage
Too high gain
Too much time required to charge and discharge the LDO
Too much charge required for startup
Too much charge lost when LDO is disabled
Too high system boot-up time when LDO is used in a power management integrated circuit (PMIC) together with other LDOs
Too much time required for testing an IC hosting the LDO
It is a challenge to designers of LDOs to improve stability of LDOs and to reduce the size of the output capacitor.

SUMMARY

A principal object of the present disclosure is to reduce the size of a decoupling capacitor at the output of an LDO or of an amplifier.

A further object of the present disclosure is to reduce the footprint for an external decoupling capacitor on PCB.

A further object of the present disclosure is to improve the phase margin of an LDO.

A further object of the present disclosure is to reduce gain under low to medium load condition.

A further object of the present disclosure is to reduction time required for charging and discharging the LDO.

Furthermore an object of the present disclosure is to reduce charge required for startup of LDO.

Moreover an object of the present disclosure is to reduce loss of charge when the LDO is disabled.

In accordance with the objects of this disclosure a driver circuit for low drop-out regulators or amplifiers allowing reducing a size of an output capacitor while maintaining high stability of the low drop-out regulator (LDO) or of the amplifier within a high range of load current has been achieved. The driver circuit disclosed comprises: a pass transistor connected between a supply voltage and an output node wherein a gate of the pass transistor is controlled by a voltage representing a difference between a reference voltage and an actual output voltage of the LDO, and wherein the gate of the pass transistor is connected in a current mirror configuration to a gate of a first current mirror transistor forming a current mirror, said first current mirror transistor having a smaller size than the pass transistor, wherein the first current mirror transistor is connected between the supply voltage and a first supplemental transistor, said first supplemental transistor having a drain connected to the drain of the first current mirror transistor and a source connected to ground voltage, and a circuitry attached to the current mirror configured to nonlinear mirroring of the load current and capable of allowing reducing small signal impedance at the gate of the pass transistor as the load current increases, hence allowing reducing the size of an output capacitor without compromising stability of the system.

In accordance with the objects of this disclosure a method for a driver circuit for low drop-out regulators or amplifiers, allowing reducing a size of an output capacitor while maintaining high stability of the low drop-out regulator (LDO) or of the amplifier within a high range of load current, has been achieved. The method disclosed comprises the steps of: (1) providing a low drop-out or an amplifier'comprising a pass transistor, wherein a gate of the pass transistor is connected in a current mirror configuration to a gate of a first current mirror transistor, and a first supplemental transistor having a drain connected to a drain of the first current mirror transistor, and (2) compensating for increased capacitance at the gate of the pass transistor when the pass transistor is in an active region, at low to medium load currents.

BRIEF DESCRIPTION OF THE DRAWINGS

In the accompanying drawings forming a material part of this description, there is shown:

FIG. 3 depicts a comparison of phase margins of an LDO with a driver stage according to the circuit of FIG. 1 with an LDO with a driver stage according the circuit of FIG. 2a.

DETAILED DESCRIPTION

Disclosed are embodiments of drive stages of LDO's. It should be noted that the drive stages could be used for amplifiers as well.

Figure 1:
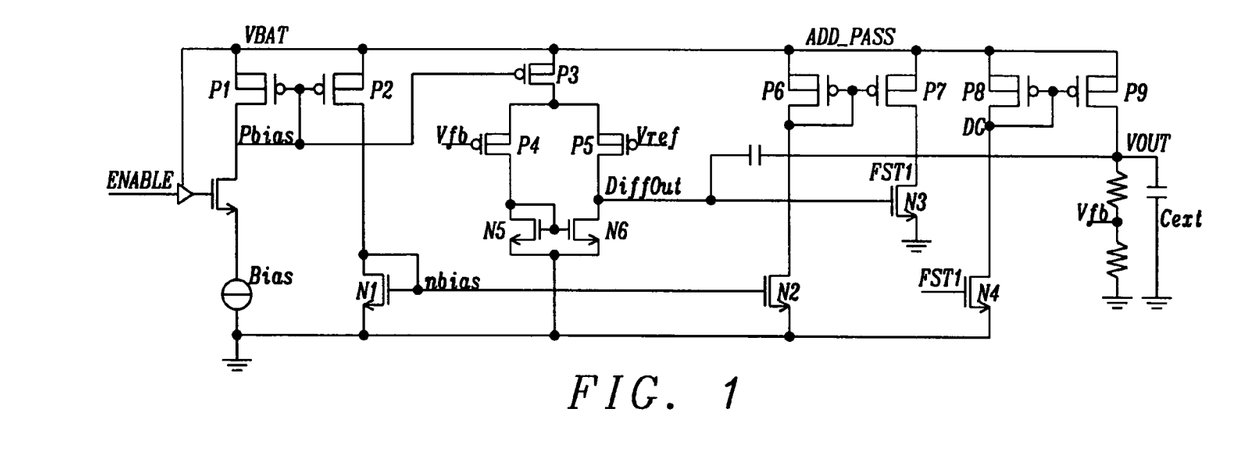
FIG. 1 shows a simplified schematic of the LDO whose pass transistor is driven by a driver stage.

FIG. 1 shows a simplified schematic for a LDO whose pass transistor P9 is driven by a driver stage N4/P8. The small signal impedance R seen at gate of pass device P9 is given by following equation:

$$R=1/(gds_{N4}+gm_{P8})\approx 1/gm_{P8}(\text{where } gm=\text{transconductance})$$

The driver stage has P8 in a diode configuration and the current in P8 corresponds to a ratio of the load current. As the load current increases the current in P8 also increases. This increase of the current of P8 increases the transconductance of P8 and thus reduces the impedance at gate of pass transistor P9. The reduction of the impedance at gate of the pass transistor P9 helps to keep the relative position of pole at output node Vout and at gate of P9 constant It has to be noted that in practice the capacitance seen at gate of P9 changes as the transistor P9 transits from active state (saturated state) to linear region of operation depending on the load current. For small currents at the output, pass transistor P9 is in saturation and there is a small signal gain from node DG to node Vout. The pass transistor P9 must also be capable of supplying large currents which relates to a very large device size. A large device size relates to a large "gate to drain" capacitance ($C_{gd}$). This $C_{gd}$ acts as Miller capacitor and results in a much larger capacitance seen at gate of P9 when P9 is in active region of operation.

The equations below give an approximate capacitance CG9 seen at gate of P9 under different region of operation, which in turn depend the current load at node Vout.

The following equations are valid for the capacitance CG9 depending on different current load at the output node Vout:

$$CG9=Cgs_{P8}+Cgs_{P9}+Cgd_{P9}*A_{out}(P9 \text{ in active/saturation region})$$

$$CG9=Cgs_{P8}+2*Cgs_{P9}(P9 \text{ in linear/triode region}),$$

wherein Aout is small signal gain from node DG to node VOUT, Cgs is gate to source capacitance, and Cgd is gate to drain capacitance.

The increased capacitance CG9 at gate of P9 in active region does not allow maintaining a constant separation between the pole at Vout and DG. Load current for which P9 is in active region of operation results in lower phase margin of the system and could make the system unstable. To compensate for this a larger capacitor is needed at the output of the LDO.

One technique would be to increase the transconductance of P8 under low to medium load conditions, which also relates to increase in the current in P8 under low to medium load conditions.

Figure 2A:
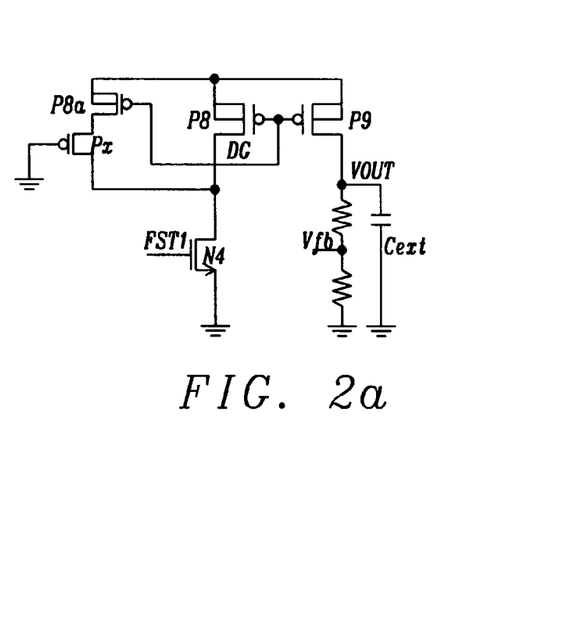
FIG. 2a shows a modified driver stage of an LDO.

The circuit of FIG. 2a shows the modified driver stage of an LDO. Transistors P8a and Px are added in parallel to transistor P8 showed in FIG. 1. It should be noted that more than one transistor P8a could be deployed in parallel and transistor Px is a switch which can be biased with any potential at its gate. As required by design, more branches like P8a and Px can be added in parallel, with different size if needed. Px can also be replaced by a resistor. Different Px transistors are used for different branches. Different branches can have different size for P8a and Px.

Figure 2B:
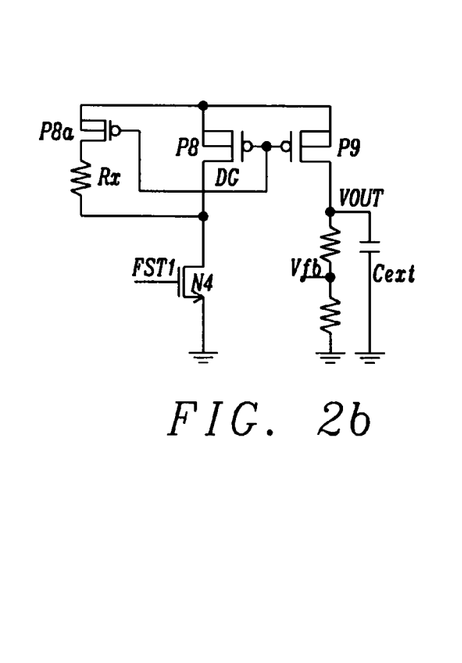
FIG. 2b shows the modified driver stage of FIG. 2a wherein a resistor replaces a transistor.
Figure 2C:
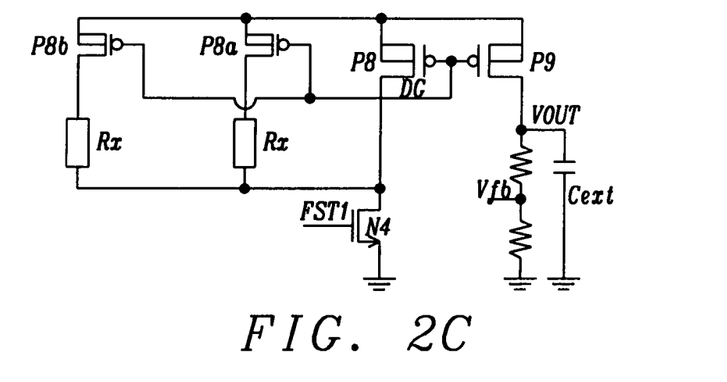
FIG. 2c shows the modified driver stage of FIG. 2a wherein a resistor replaces a transistor.

FIG. 2b illustrates how resistor Rx replaces transistor Px as shown in FIG. 2a. FIG. 2c depicts how additional transistors P8b together with additional resistors Rx can be deployed. As already outlined above and shown in FIG. 2a, these resistors Rx can be replaced by transistors Px.

Under low load and medium load condition P8a is in active region of operation i.e. $Vds_{P8a}>Vgs_{P8a}-Vth_{P8a}$. This means the small signal impedance seen at gate of transistor P9 is follows:

$$R=1/(gds_{N4}+gm_{P8}+gm_{P8a})\approx 1/(gm_{P8}+gm_{P8a})$$

Depending on sizes of P8a and Px the small signal impedance R can be modified as required by design. Reduction of R as seen at gate of P9 compensates the increased capacitance seen at gate of P9 when P9 is in active region of operation As load increases P8a transits from active region to deep triode region as the voltage drop across Px increases and the impedance R seen at gate of P9 reduces back to $$R=1/(gds_{N4}+gm_{P8})\approx 1/gm_{P8}(\text{wherein } gm=\text{transconductance}).$$

Figure 3:
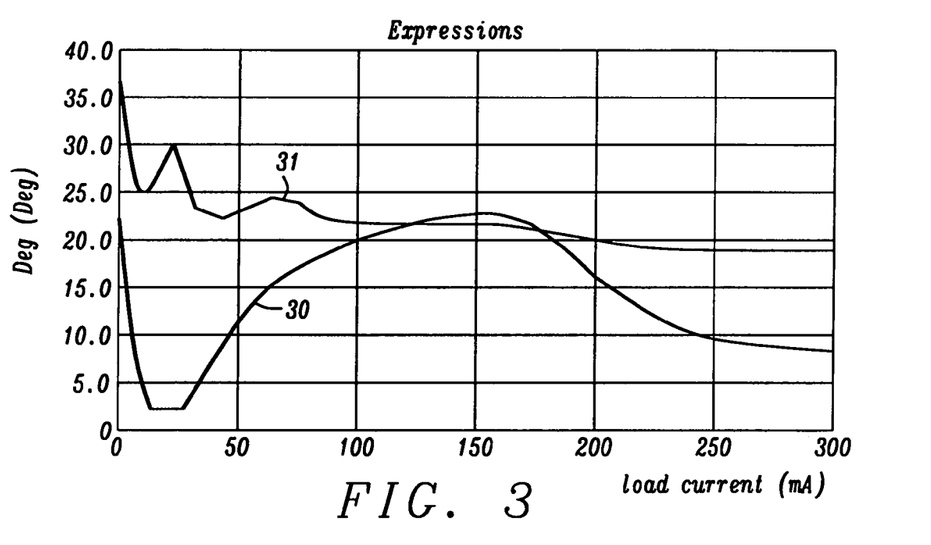

FIG. 3 depicts a comparison of phase margins 30 of an LDO with a driver stage according to the circuit of FIG. 1 with phase margins 31 of an LDO with a driver stage according the circuit of FIG. 2a. As a non-limiting example FIG. 3 compares 300 mA LDOs having each a 450 nF output capacitor.

FIG. 3 clearly shows that the LDO with the driver stage shown in FIG. 1 has a very small phase margin 30 at low loads, but a considerable improvement is observed for the phase margin 31 of the driver stage shown in FIG. 2a. The driver stage of FIG. 1 requires a 4.7 uF output capacitor, while the output capacitor of the driver stage of FIG. 2a can be reduced to 1 uF and lower.

Figure 4:
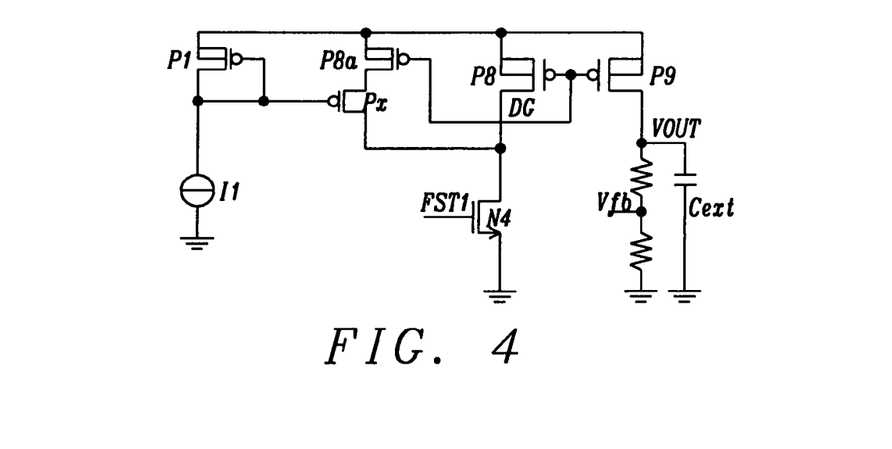
FIG. 4 illustrates how the gate of transistor Px is controlled by a diode connected transistor P1 and current source I1.
Figure 5:
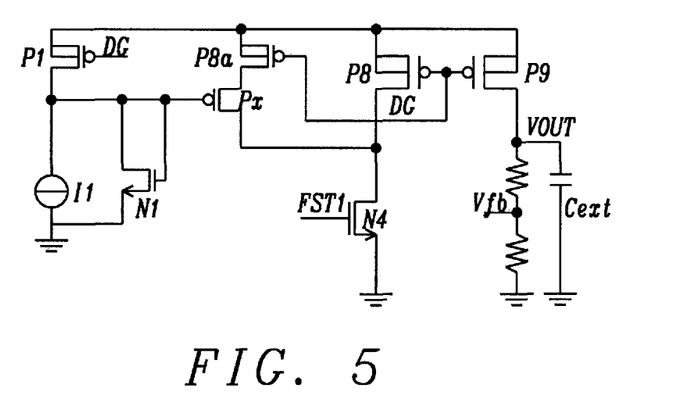
FIG. 5 depicts how the gate of transistor Px is a function of the load current.

FIGS. 4-5 show variations of the way to control the gate of Px.

FIG. 4 illustrates how the gate of Px is controlled by diode connected transistor P1 and current source I1. Depending on the current source I1 the gate potential of transistor Px can be modified. It should be noted that current I1 is independent of the load current.

In FIG. 5 the gate of transistor Px is a function of the load current. The gate of transistor P1 is connected to node DG. At low loads current from transistor P1 is by far smaller than current I1 and the gate of Px is pulled to ground. As load current and subsequently current through P1 get higher than current I1, the part of the current through P1, which is higher than current I1 flows through diode connected transistor N1 generating the control voltage at gate of Px. In the circuit of FIG. 5 the gate of Px is a function of the load current. At low loads, current from P1 is far smaller than I1 and gate of Px is pulled to ground. As load current and current through P1 get higher than current I1, the extra current flows through diode connected N1 generating the control voltage at gate of Px.

Figure 6:
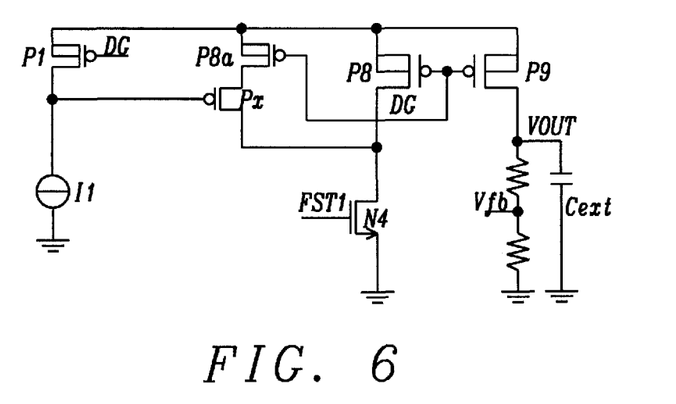
FIG. 6 shows a variation of the circuit of FIG. 5 using also transistors P1 and I1 but without transistor N1.

FIG. 6 shows a variation of the circuit of FIG. 5 using also transistors P1 and I1 but without transistor N1. Once a current from P1 is higher than the current I1 the gate of Px is pulled to supply and P8a moves from active to deep triode mode. Transistor P1 and the current source I1 form a current comparator.

Figure 7:
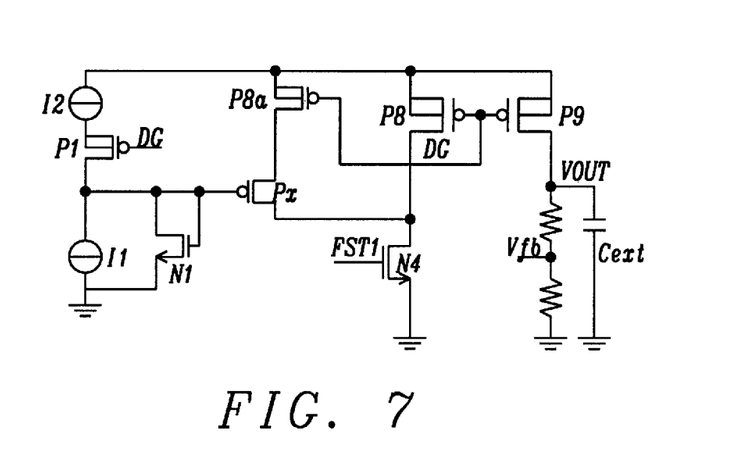
FIG. 7 shows a circuit wherein the gate of Px is dynamically biased.

FIG. 7 shows a circuit wherein the gate of Px is dynamically biased if the current of current source I2 is higher than the current of current source I1. Once the load current is low, current source I2 is in deep triode mode and the gate of Px is pulled to ground. As the load current increases the potential at DG node decreases and I2 starts to increase till it gets saturated and the part of the I2 current, which is higher than current I1 flows through transistor N1 to generate the biasing potential for gate of Px.

Figure 8:
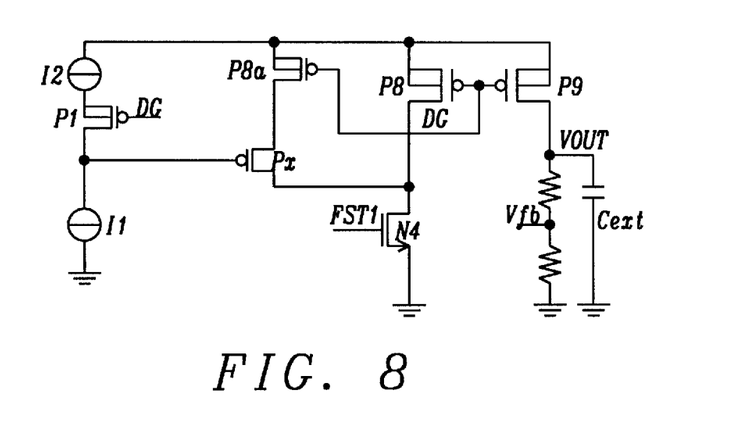
FIG. 8 shows a variation of the circuit of FIG. 7.

FIG. 8 shows a variation of the circuit of FIG. 7 without transistor N1. Once the load current at output is large enough to get I2 saturated, the gate of transistor Px is pulled to supply and transistor P8a moves from active to deep triode region of operation. Current source I2 has to be higher than current source I1.

Figure 9:
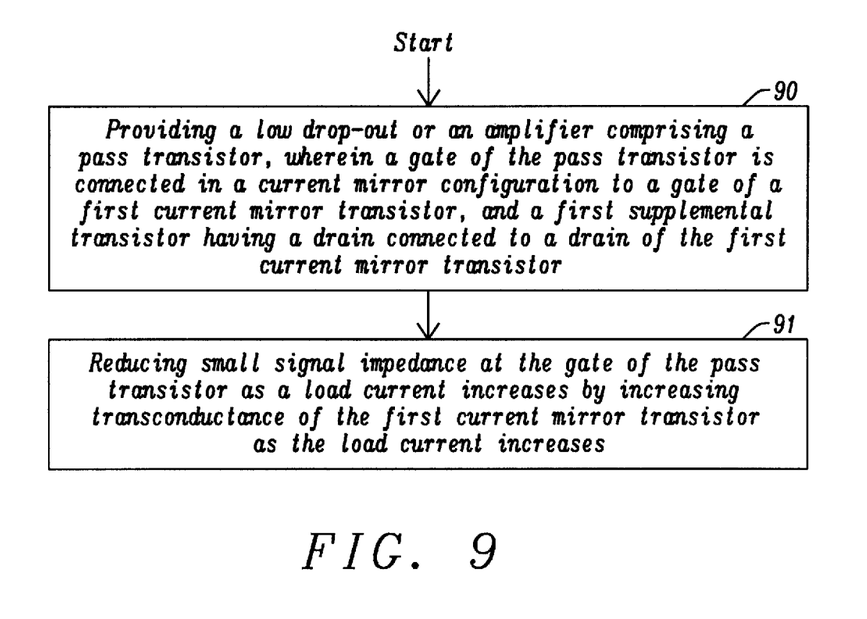
FIG. 9 shows a flowchart of a method for a driver circuit for low drop-out regulators or amplifiers allowing reducing a size of an output capacitor while maintaining high stability of the low drop-out regulator (LDO) or of the amplifier within a high range of load current.

FIG. 9 shows a flowchart of a method for a driver circuit for low drop-out regulators or amplifiers allowing reducing a size of an output capacitor while maintaining high stability of the low drop-out regulator (LDO) or of the amplifier within a high range of load current. A first step 90 depicts provision of a low drop-out or an amplifier comprising a pass transistor, wherein a gate of the pass transistor is connected in a current mirror configuration to a gate of a first current mirror transistor, and a first supplemental transistor having a drain connected to a drain of the first current mirror transistor. The next step 91 shows compensating increased capacitance at the gate of the pass transistor occurring as the load current increases. This is performed in the preferred embodiment by reducing small signal impedance of the first current mirror transistor as the load current increases.

In summary, the disclosure teaches nonlinear mirroring of the load current allowing scaling of gain or adapting small signal impedance of the pass transistor depending on other inputs, in case of the preferred embodiment, allowing to reduce small signal impedance at the gate of the pass transistor as the load current increases, hence allowing to reduce the size of an output capacitor without compromising stability of the system. Furthermore it should be noted that the pass transistor need not be PMOS it can be NMOS or BJT or FET as well.

While the disclosure has been particularly shown and described with reference to the preferred embodiments thereof, it will be understood by those skilled in the art that various changes in form and details may be made without departing from the spirit and scope of the disclosure.

What is claimed is:

1. A driver circuit for low drop-out regulators allowing reducing a size of an output capacitor while maintaining stability of the low drop-out regulator (LDO) within a range of load current, comprising:
    a pass transistor connected between a supply voltage and an output node wherein a gate of the pass transistor is controlled by a voltage representing a difference between a reference voltage and an actual output voltage of the LDO, and wherein the gate of the pass transistor is connected in a current mirror configuration to a gate of a first current mirror transistor forming a current mirror;
    said first current mirror transistor having a smaller size than the pass transistor, wherein the first current mirror transistor is connected between the supply voltage and a first supplemental transistor, wherein a drain of the first current mirror transistor and a drain of the pass transistor are not connected to each other;
    said first supplemental transistor having a drain connected to the drain of the first current mirror transistor and a source connected to ground voltage; and
    a circuitry attached to the current mirror configured to nonlinear mirroring of the load current and capable of allowing reducing small signal impedance at the gate of the pass transistor as the load current increases, hence allowing reducing the size of an output capacitor without compromising stability of the system, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and the resistive means, wherein a second terminal of the resistive means is connected to a node between the first current mirror transistor and the supplemental transistor.

2. The driver circuit of claim 1, wherein said resistive means is a resistor.

3. The driver circuit of claim 1, wherein said resistive means is a transistor.

4. The driver circuit of claim 1, wherein additional branches are deployed in parallel to the first branch, wherein each additional branch comprises a current mirror transistor, wherein a source of said current mirror transistor of each additional branch is connected to the supply voltage, a gate of said current mirror transistor of each additional branch is connected to the gate of the pass transistor and a drain of said current mirror transistor is connected to a first terminal of a resistive means and said resistive means, wherein a second terminal of the resistive means is connected to a node between the first current mirror transistor and the supplemental transistor.

5. The driver circuit of claim 1, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor (N4) and wherein a gate of the transistor (Px) is controlled by a diode connected transistor (P1) and by a current source (I1), wherein a source of transistor (P1) is connected to the supply voltage of the driver circuit and a drain of transistor (P1) is connected to the gate of transistor (PX) and to a first terminal of the current source (I1), wherein a second terminal of the current source (I1) is connected to ground.

6. The driver circuit of claim 1, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dependent on the load current of the pass transistor, wherein the gate voltage of transistor (Px) is controlled by transistor (P1), diode connected transistor (N1), and by a current source (I1), wherein a gate of transistor (P1) is connected to the gate of the pass transistor, a source of transistor (P1) is connected to the supply voltage of the driver circuit and a drain of transistor (P1) is connected to the gate of transistor (PX), to a first terminal of the current source (I1), and to a drain and a gate of the transistor (N1), wherein a second terminal of the current source (I1) and a source of transistor (N1) are connected to ground.

7. The driver circuit of claim 1, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor (N4), wherein a gate voltage of the transistor (Px) is configured to be dependent on the load current of the pass transistor wherein the gate voltage of transistor (Px) is controlled by transistor (P1) and by a first current source (I1), wherein a gate of transistor (P1) is connected to the gate of the pass transistor, a source of transistor (P1) is connected to the supply voltage of the driver circuit and a drain of transistor (P1) is connected to the gate of transistor (PX) and to a first terminal of the first current source (I1), wherein a second terminal of the first current source (I1) is connected to ground.

8. The driver circuit of claim 1, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dynamically biased, wherein the gate voltage of transistor (Px) is controlled by transistor (P1), diode connected transistor (N1), and by a first current source (I1), wherein a gate of transistor (P1) is connected to the gate of the pass transistor, a source of transistor (P1) is connected to second terminal of a second current source (I2), wherein a first terminal of the second current source (I2) is connect to the supply voltage of the driver circuit and a drain of transistor (P1) is connected to the gate of transistor (PX), to a first terminal of the first current source (I1), and to a drain and a gate of the transistor (N1), wherein a second terminal of the first current source (I1) and a source of transistor (N1) are connected to ground.

9. The driver circuit of claim 1, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dynamically biased, wherein the gate voltage of transistor (Px) is controlled by transistor (P1) and by a first current source (I1), wherein a gate of transistor (P1) is connected to the gate of the pass transistor, a source of transistor (P1) is connected to second terminal of a second current source (I2), wherein a first terminal of the second current source (I2) is connect to the supply voltage of the driver circuit and a drain of transistor (P1) is connected to the gate of transistor (PX), to a first terminal of the first current source (I1) wherein a second terminal of the current source (I1) is connected to ground.

10. A method for a driver circuit for low drop-out regulators or amplifiers allowing reducing a size of an output capacitor while maintaining stability of the low drop-out regulator (LDO) or of the amplifier within a range of load current comprising the steps of:
(1) providing a low drop-out or an amplifier comprising a pass transistor, wherein a gate of the pass transistor is connected in a current mirror configuration to a gate of a first current mirror transistor, and a first supplemental transistor having a drain connected to a drain of the first current mirror transistor; and
(2) compensating increased capacitance at the gate of the pass transistor occurring as load current increases, wherein said capacitance at the gate of the pass transistor is compensated by a circuitry attached configured to reducing small signal impedance of the first current mirror transistor as the load current increases;
wherein the small signal impedance of the first current mirror transistor is reduced by a circuitry attached to the current mirror configured to nonlinear mirroring of the load current and reducing small signal impedance at the gate of the pass transistor as the load current increases, hence allowing reducing the size of an output capacitor without compromising stability of the system and wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and the resistive means, wherein a second terminal of the resistive means is connected to a node between the first current mirror transistor and the supplemental transistor.

11. The method of claim 10, wherein additional branches are deployed in parallel to the first branch, wherein each additional branch comprises a current mirror transistor, wherein a source of said current mirror transistor of each additional branch is connected to the supply voltage, a gate of said current mirror transistor of each additional branch is connected to the gate of the pass transistor and a drain of said current mirror transistor is connected to a first terminal of a resistive means and said resistive means, wherein a second terminal of the resistive means is connected to a node between the first current mirror transistor and the supplemental transistor.

12. The method of claim 10, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dependent on the load current of the pass transistor, wherein the gate voltage of transistor (Px) is controlled by transistor (P1), diode connected transistor (N1), and by a current source (I1), wherein a gate of transistor (P1) is connected to the gate of the pass transistor, a source of transistor (P1) is connected to the supply voltage of the driver circuit and a drain of transistor (P1) is connected to the gate of transistor (PX), to a first terminal of the first current source (I1), and to a drain and a gate of the transistor (N1), wherein a second terminal of the first current source (I1) and a source of transistor (N1) are connected to ground.

13. The method of claim 10, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dependent on the load current of the pass transistor wherein the gate voltage of transistor (Px) is controlled by transistor (P1), diode connected transistor (N1), and by a current source (I1), wherein a gate of transistor (P1) is connected to the gate of the pass transistor, a source of transistor (P1) is connected to the supply voltage of the driver circuit and a drain of transistor (P1) is connected to the gate of transistor (PX), to a first terminal of the first current source (I1) and to a drain and a gate of the transistor (N1), wherein a second terminal of the first current source (I1) and a source of transistor (N1) are connected to ground.

14. The method of claim 10, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor (N4), wherein a gate voltage of the transistor (Px) is configured to be dependent on the load current of the pass transistor wherein the gate voltage of transistor (Px) is controlled by transistor (P1) and by a first current source (I1), wherein a gate of transistor (P1) is connected to the gate of the pass transistor, a source of transistor (P1) is connected to the supply voltage of the driver circuit and a drain of transistor (P1) is connected to the gate of transistor (PX) and to a first terminal of the first current source (I1), wherein a second terminal of the first current source (I1) is connected to ground.

15. The method of claim 10, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor (Px), wherein a source of the transistor (PX) is connected to a drain of the second current mirror transistor and a drain of the transistor (Px) is connected to a node between the first current mirror transistor and the supplemental transistor, wherein a gate voltage of the transistor (Px) is configured to be dynamically biased, wherein the gate voltage of transistor (Px) is controlled by transistor (P1), diode connected transistor (N1), and by a first current source (I1), wherein a gate of transistor (P1) is connected to the gate of the pass transistor, a source of transistor (P1) is connected to second terminal of a second current source (I2), wherein a first terminal of the second current source (I2) is connect to the supply voltage of the driver circuit and a drain of transistor (P1) is connected to the gate of transistor (PX), to a first terminal of the first current source (I1) and to a drain and a gate of the transistor (N1), wherein a second terminal of the first current source (I1) and a source of transistor (N1) are connected to ground.

16. The method of claim 10, wherein the circuitry attached comprises a first circuit branch comprising a second current mirror transistor, which is deployed between the supply voltage and a first terminal of a resistive means, wherein a gate of the second current mirror transistor is connected to a gate of the first current mirror transistor and a transistor Px, wherein a source of the transistor (PX) is connected to a drain of the second current mirror transistor and a drain of the transistor (Px) is connected to a node between the first current mirror transistor and the supplemental transistor (N4), wherein a gate voltage of the transistor (Px) is configured to be dynamically biased, wherein the gate voltage of transistor Px) is controlled by transistor (P1) and by a first current source (I1), wherein a gate of transistor (P1) is connected to the gate of the pass transistor, a source of transistor (P1) is connected to second terminal of a second current source (I2) wherein a first terminal of the second current source (I2) is connect to the supply voltage of the driver circuit and a drain of transistor (P1) is connected to the gate of transistor (PX), to a first terminal of the first current source (I1), wherein a second terminal of the first current source I1 is connected to ground.

* * * * *